United States Patent
Sekine et al.

(10) Patent No.: US 10,291,021 B2
(45) Date of Patent: May 14, 2019

(54) PROTECTION CIRCUIT AND ELECTRONIC DEVICE

(71) Applicant: NLT Technologies, Ltd., Kawasaki, Kanagawa (JP)

(72) Inventors: Hiroyuki Sekine, Kawasaki (JP); Yusuke Yamamoto, Kawasaki (JP)

(73) Assignee: NLT Technologies, Ltd., Kawasaki, Kanagawa (JP)

(*) Notice: Subject to any disclaimer, the term of this patent is extended or adjusted under 35 U.S.C. 154(b) by 54 days.

(21) Appl. No.: 15/299,524

(22) Filed: Oct. 21, 2016

(65) Prior Publication Data
US 2017/0117705 A1 Apr. 27, 2017

(30) Foreign Application Priority Data
Oct. 23, 2015 (JP) ................. 2015-208884

(51) Int. Cl.
| | |
|---|---|
| *G09G 3/36* | (2006.01) |
| *H02H 9/04* | (2006.01) |
| *H01L 27/12* | (2006.01) |
| *H01L 29/786* | (2006.01) |
| *G09G 3/20* | (2006.01) |

(52) U.S. Cl.
CPC ............. *H02H 9/045* (2013.01); *G09G 3/20* (2013.01); *G09G 3/36* (2013.01); *H01L 27/124* (2013.01); *H01L 29/7869* (2013.01); *G09G 2330/025* (2013.01); *G09G 2330/04* (2013.01)

(58) Field of Classification Search
CPC ............. G09G 3/20; G09G 2330/025; G09G 2330/04; G09G 3/36; H01L 27/0266; H01L 27/124; H01L 29/7869; G01R 1/30
See application file for complete search history.

(56) References Cited

U.S. PATENT DOCUMENTS

| | | | | |
|---|---|---|---|---|
| 5,272,586 A | * | 12/1993 | Yen ................. | H02H 9/046 257/356 |
| 5,744,837 A | | 4/1998 | Kamiura et al. | |
| 6,914,643 B1 | | 7/2005 | Nagase et al. | |

(Continued)

FOREIGN PATENT DOCUMENTS

| | | |
|---|---|---|
| JP | 63-220289 A | 9/1988 |
| JP | 08-146460 A | 6/1996 |

(Continued)

*Primary Examiner* — Stacy Khoo
(74) *Attorney, Agent, or Firm* — Sughrue Mion, PLLC

(57) ABSTRACT

A protection circuit includes a control circuit that controls current between a first wiring and a second wiring and an application circuit that applies a voltage to the control circuit. The control circuit includes a first thin film transistor that controls the current. The application circuit includes second and third thin film transistors that are connected in series. Each of the second and third thin film transistors includes first and second gates. The first gate of the second thin film transistor is connected to the first wiring. The first gate of the third thin film transistor is connected to a connection point between the second and third thin film transistors. The second gates of the second thin film transistor and the third thin film transistor are connected to the second wiring. The application circuit applies a voltage of the connection point to a gate of the first thin film transistor.

11 Claims, 12 Drawing Sheets

(56) References Cited

U.S. PATENT DOCUMENTS

2008/0198518 A1\* 8/2008 Choi ..................... H02H 9/046
　　　　　　　　　　　　　　　　　　　　　　361/56
2013/0188110 A1\* 7/2013 Miyamoto .......... H01L 27/1225
　　　　　　　　　　　　　　　　　　　　　　349/46

FOREIGN PATENT DOCUMENTS

| JP | 2005-136028 A | 5/2005 |
|----|---------------|--------|
| JP | 2009-187029 A | 8/2009 |

\* cited by examiner

F I G. 1
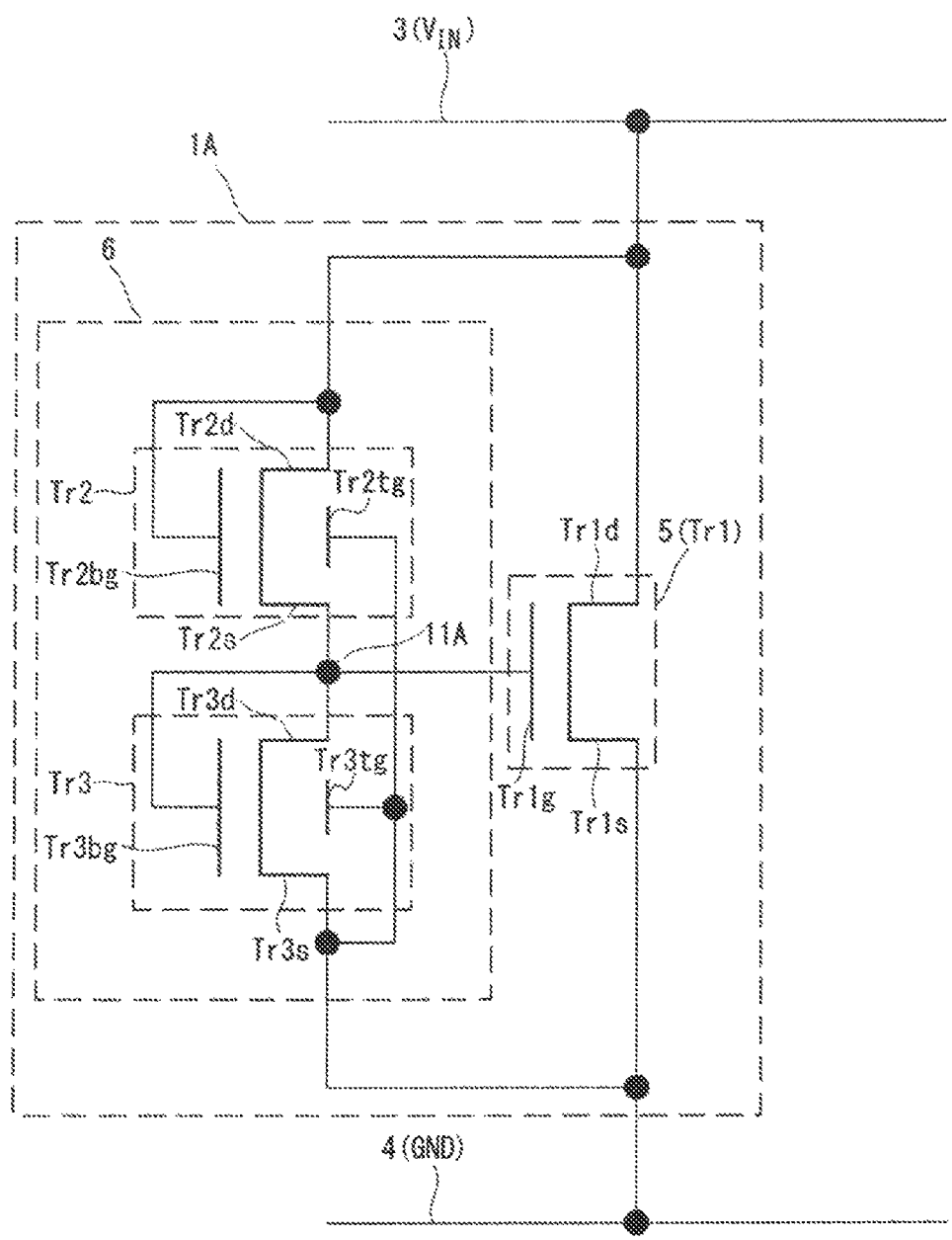

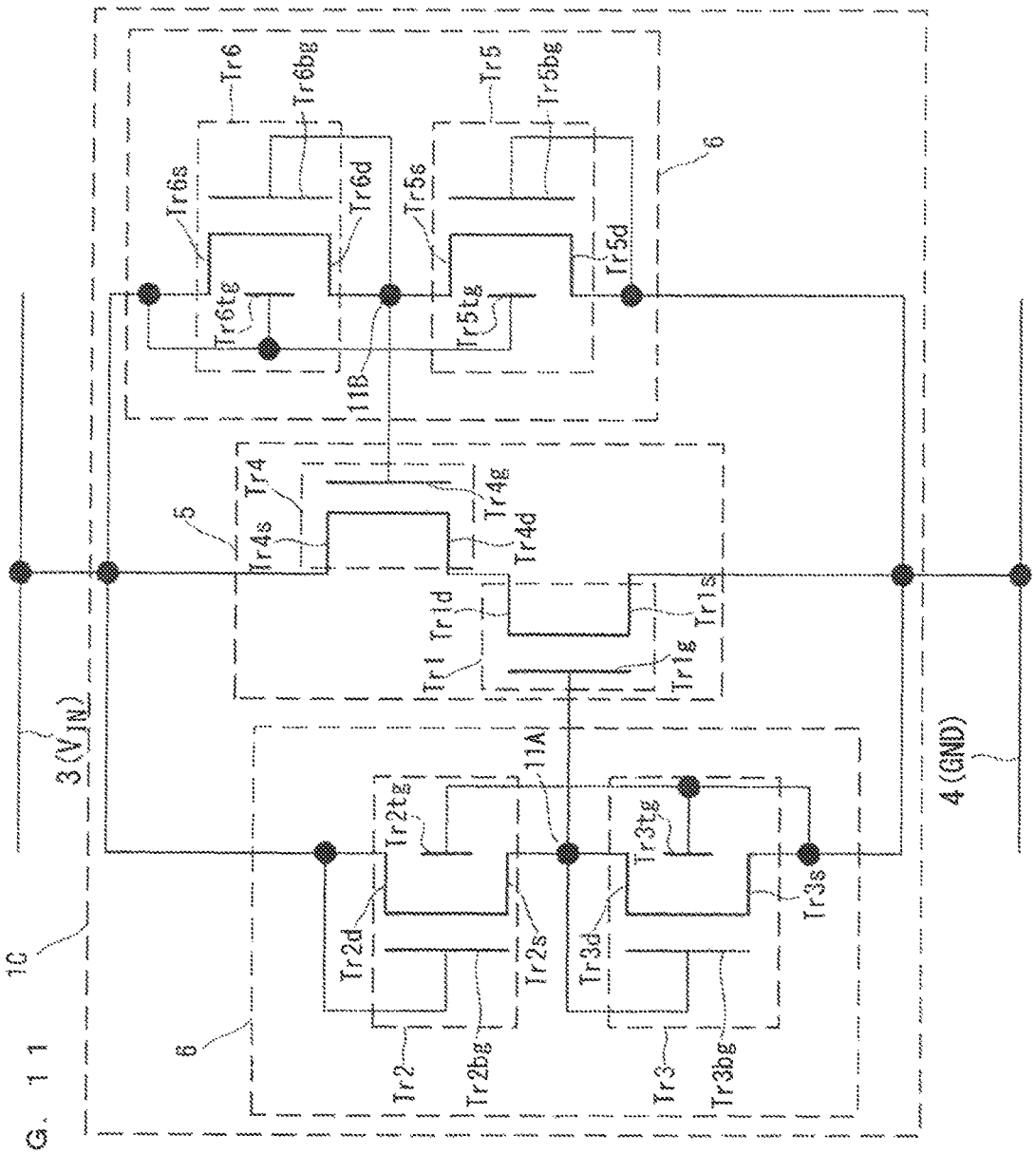

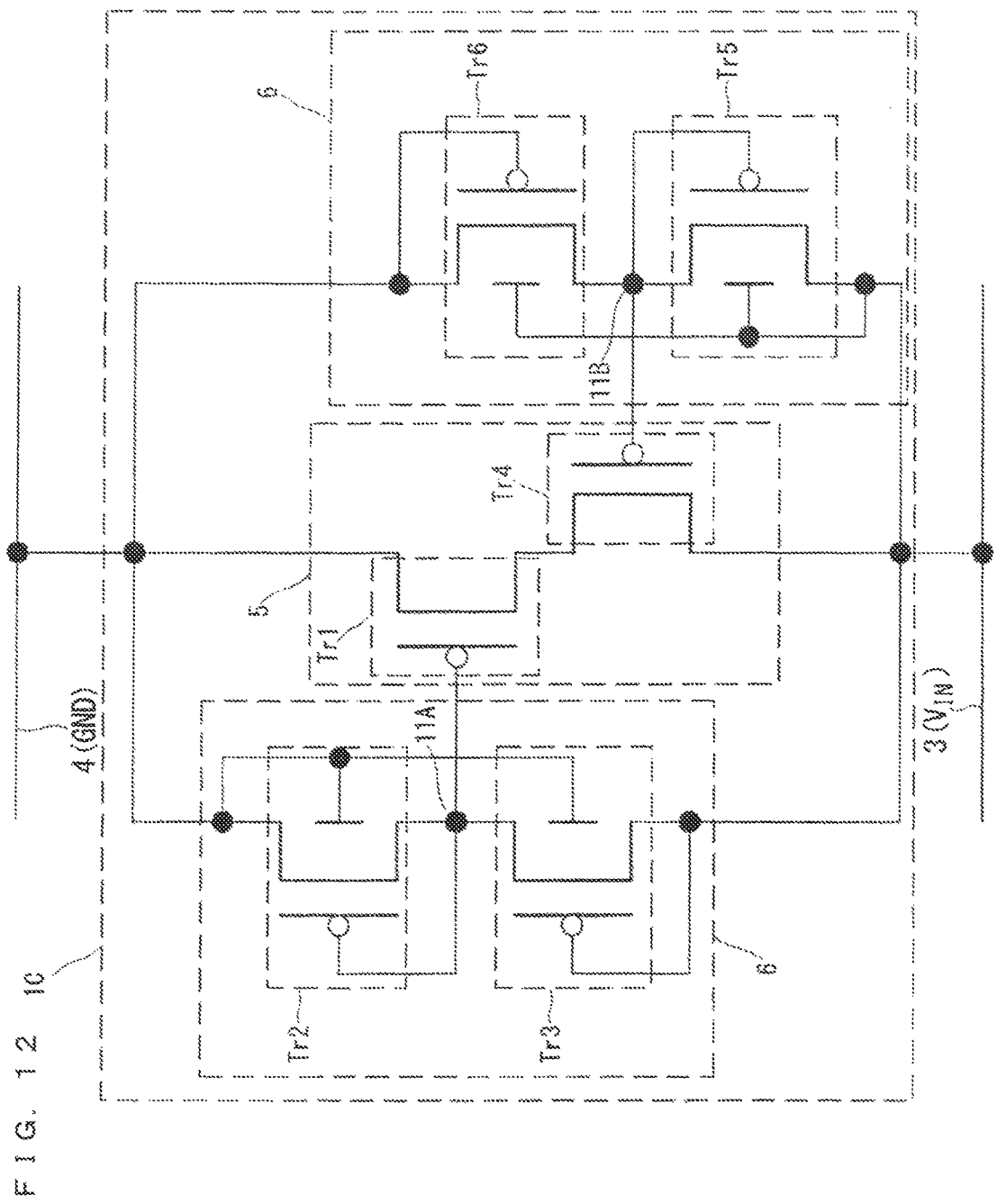

PROTECTION CIRCUIT AND ELECTRONIC DEVICE

CROSS-REFERENCE TO RELATED APPLICATIONS

This non-provisional application claims priority under 35 U.S.C. § 119(a) on Patent Application No. 2015-208884 filed in Japan on Oct. 23, 2015, the entire contents of which are hereby incorporated by reference.

FIELD

The present disclosure relates to a protection circuit and an electronic device.

BACKGROUND

An electronic device, such as a liquid crystal display device, is provided with a protection circuit that protects the electronic device from an overvoltage caused by, for example, static electricity. The protection circuit is provided between a signal line connected to, for example, the electronic device and a ground line, and allows current to flow to the ground line when an overvoltage is applied to the signal line, thereby protecting the electronic device.

As the protection circuit, the circuit has been developed which has a structure in which a source electrode and a drain electrode of two thin film transistors (TFT) are connected in parallel or in series to each other in an opposite direction.

However, when two oxide semiconductor TFTs of thin film transistors are connected in parallel to each other to form the protection circuit, overcurrent may flow even if a voltage within a driving voltage range of an electronic device is applied, because the threshold voltage and sub-threshold swing (SS) of the oxide semiconductor TFT are less than those of an amorphous silicon TFT (a-Si TFT). When two oxide semiconductor TFTs are connected in series with each other to form the protection circuit, there is a case where no current flows to the earth line even if an overvoltage is applied to the signal line because off current is very small.

For example, Japanese Patent Application Laid-Open No. S63-220289 (hereinafter, referred to as Patent Document 1) discloses the protection circuit which connects a shunt wire and a wire to be protected from static electricity using two TFTs in which a drain or a source and a gate are connected to each other. However, in the protection circuit disclosed in Patent Document 1, in a case in which an oxide semiconductor TFT is used as the TFT, even if a voltage for normally operating the liquid crystal display device is applied, a large amount of current is possibly to flow to the shunt wire through the protection circuit. This is caused by the characteristics of the oxide semiconductor TFT. In the characteristics, a threshold voltage is low and a sub-threshold swing is small.

Japanese Patent Application Laid-Open No. H08-146460 (hereinafter, referred to as Patent Document 2) discloses the discharge circuit in which a plurality of protection circuits are connected in series to each other to control an operating voltage. In the discharge circuit disclosed in Patent Document 2, when the operating voltages of the protection circuits are equal to each other, n protection circuits are connected in series to each other to increase the operating voltage by n times.

Japanese Patent Application Laid-Open No. 2009-187029 (hereinafter, referred to as Patent Document 3) discloses the protection circuit in which a voltage that is generated due to static electricity is divided by two resistors and the divided voltages are applied to a gate of transistors forming the protection circuit to control an operating voltage.

Japanese Patent Application Laid-Open No. 2005-136028 (hereinafter, referred to as Patent Document 4) discloses an electrostatic protection circuit in which a double-gate (dual-gate) thin film transistor is used, a top gate electrode of the thin film transistor is connected to a source electrode and one connection terminal, a bottom gate electrode of the thin film transistor is connected to a drain electrode and the other connection terminal. The ON/OFF states of the double-gate thin film transistor are controlled on the basis of a gate voltage which is applied to the top gate electrode and the bottom gate electrode.

In the discharge circuit disclosed in Patent Document 2, when the operating voltage of each protection circuit is low, the number of protection circuits which are required to be operated at a desired voltage increases, which results in an increase in the size of the discharge circuit. In addition, the amount of current during the operation of the discharge circuit is reduced in inverse proportion to the number of protection circuits. Therefore, when the number of protection circuits increases, the capability of the discharge circuit to make static electricity flow is reduced.

In the protection circuit disclosed in Patent Document 3, when the resistance value of the resistor used for voltage division is not appropriate, the amount of current flowing through the resistor increases. Therefore, a material suitable for forming the resistor is limited. As a result, in some cases, an appropriate resistor is not obtained and it is difficult to adjust the gate voltage of the transistor provided in the protection circuit to a desired voltage.

The electrostatic protection circuit disclosed in Patent Document 4 uses the difference between the threshold voltage of the bottom gate and the threshold voltage of the top gate. Patent Document 4 does not disclose a method for arbitrarily controlling the threshold voltages of the bottom gate and the top gate.

SUMMARY

In order to solve the above-mentioned problems, an aspect of an embodiment uses, for example, the following means.

A protection circuit according to an embodiment includes a control circuit that controls current between a first wiring and a second wiring and an application circuit that applies a voltage to the control circuit. The control circuit includes a first thin film transistor that controls the current. The application circuit includes a second thin film transistor and a third thin film transistor that are connected in series to each other. Each of the second thin film transistor and the third thin film transistor includes a first gate and a second gate. The first gate of the second thin film transistor is connected to the first wiring. The first gate of the third thin film transistor is connected to a connection point between the second thin film transistor and the third thin film transistor. The second gates of the second thin film transistor and the third thin film transistor are connected to the second wiring. The application circuit applies a voltage of the connection point to a gate of the first thin film transistor.

It is to be understood that both the foregoing general description and the following detailed description are exemplary and explanatory and are not restrictive of this disclosure.

BRIEF DESCRIPTION OF THE DRAWINGS

FIG. 1 is a circuit diagram illustrating the configuration of a protection circuit according to a first embodiment;

FIG. 11 is a circuit diagram illustrating the configuration of a protection circuit according to a third embodiment; and FIG. 12 is a circuit diagram illustrating a modification example of the protection circuit according to the third embodiment.

DETAILED DESCRIPTION

Hereinafter, embodiments of the present disclosure will be described in detail with reference to the drawings.

First Embodiment

Hereinafter, a first embodiment will be described.

In the specification and the claims, ordinal numbers, such as "first", "second", and "third", are given in order to clarify the relationship between elements and to prevent confusion between the elements. Therefore, the ordinal numbers do not limit the number of elements.

In addition, "connection" means electrical connection between connection targets. The "electrical connection" includes connection between the connection targets through an electrical element, such as an electrode, a wire, a resistor, or a capacitor. The "electrode" or the "wiring" does not functionally limit these components. For example, the "wiring" may be used as a portion of the "electrode". Inversely the "electrode" may be used as a portion of the "wiring".

Figure 2:
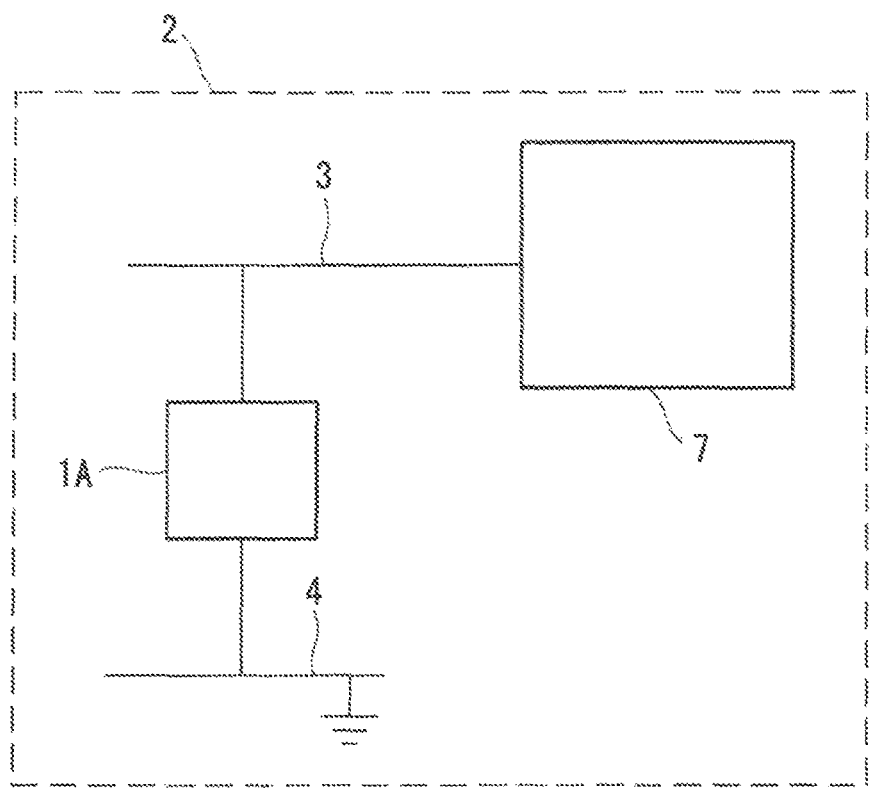
FIG. 2 is a circuit diagram illustrating the configuration of an electronic device including the protection circuit according to the first embodiment.

FIG. 1 is a circuit diagram illustrating the configuration of a protection circuit 1A according to this embodiment. FIG. 2 is a circuit diagram illustrating the configuration of an electronic device including the protection circuit 1A according to the first embodiment. The protection circuit 1A prevents an overvoltage which is caused by, for example, static electricity from being applied to an object to be protected.

As illustrated in FIG. 2, the protection circuit 1A is provided in an electronic device 2 including a device 7 to be protected, for example, a gate-in-panel (GIP) liquid crystal display (LCD) or a flat panel detector (FPD).

As illustrated in FIG. 1, the protection circuit 1A includes a control circuit 5 that controls current (hereinafter, referred to as "line current") between a first wiring 3 and a second wiring 4 and an application circuit 6 that applies a voltage to the control circuit 5.

The first wiring 3 is a signal line to which, for example, an input voltage ($V_{IN}$) is applied and the second wiring 4 is a signal line to which a reference potential is applied. In this embodiment, the reference potential is, for example, a ground potential (GND). However, it is not limited thereto. The reference potential may not be the ground potential as long as it is lower than the potential of the first wiring 3. In addition, the input voltage which is applied between the first wiring 3 and the second wiring 4 is referred to as a voltage between both ends of the protection circuit 1A.

In this embodiment, when an overvoltage is applied to the first wiring 3, the control circuit 5 operates such that current flows from the first wiring 3 to the second wiring 4 to protect the object to be protected from the overvoltage. Specifically, the control circuit 5 includes a thin film transistor Tr1 that controls the line current.

The thin film transistor Tr1 has a first electrode Tr1$d$ that is connected to the first wiring 3 and a second electrode Tr1$s$ that is connected to the second wiring 4. The thin film transistor Tr1 is an n-channel transistor. The first electrode Tr1$d$ functions as a drain electrode and the second electrode Tr1$s$ functions as a source electrode.

A gate electrode Tr1$g$ of the thin film transistor Tr1 is connected to the application circuit 6 at a connection point 11A.

The application circuit 6 includes a thin film transistor Tr2 and a thin film transistor Tr3 which are connected in series to each other.

A first electrode Tr2$d$ of the thin film transistor Tr2 is connected to the first wiring 3, and a second electrode Tr2$s$ of the thin film transistor Tr2 is connected to a first electrode Tr3$d$ of the thin film transistor Tr3. A second electrode Tr3$s$ of the thin film transistor Tr3 is connected to the second wiring 4. The thin film transistors Tr2 and Tr3 are n-channel transistors. The first electrodes Tr2$d$ and Tr3$d$ function as drain electrodes and the second electrodes Tr2$s$ and Tr3$s$ function as source electrodes.

Figure 3:
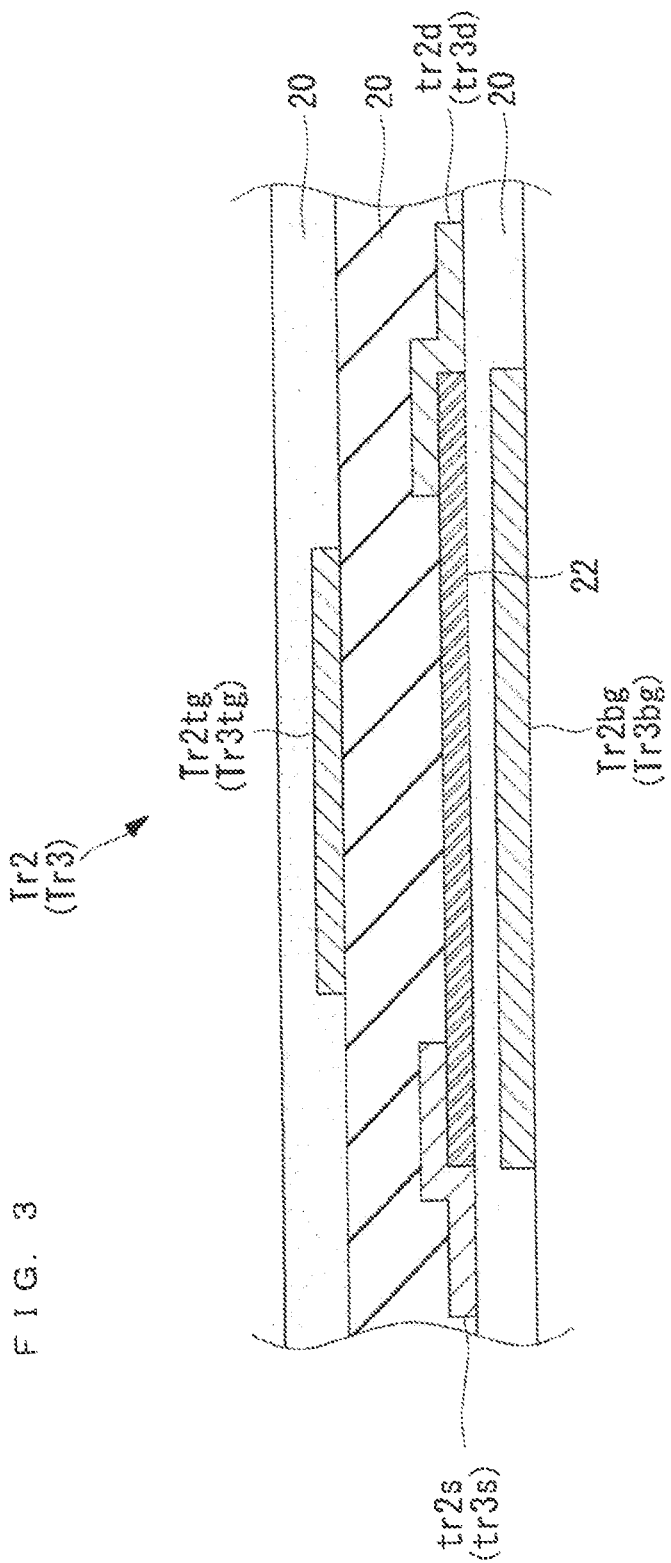
FIG. 3 is a vertical cross-sectional view illustrating the configuration of a thin film transistor with a double gate structure according to the first embodiment.

As illustrated in FIG. 3 which will be described below, the thin film transistors Tr1, Tr2, and Tr3 are oxide semiconductor TFTs having an oxide semiconductor layer 22.

Each of the thin film transistor Tr2 and the thin film transistor Tr3 is a transistor with a so-called double gate (dual gate) structure which has a bottom gate and a top gate.

That is, the thin film transistor Tr2 includes a bottom gate electrode Tr2$bg$ and a top gate electrode Tr2$tg$. Similarly, the thin film transistor Tr3 includes a bottom gate electrode Tr3$bg$ and a top gate electrode Tr3$tg$.

In this embodiment, as an example, the main control electrodes of the thin film transistors Tr2 and Tr3 are set to the bottom gate electrodes Tr2$bg$ and Tr3$bg$, respectably.

The bottom gate electrode Tr2$bg$ of the thin film transistor Tr2 is connected to the first electrode Tr2$d$ and the first wiring 3. The bottom gate electrode Tr3$bg$ of the thin film transistor Tr3 is connected to the first electrode Tr3$d$. The gate electrode Tr1$g$ of the thin film transistor Tr1 is connected to the connection point 11A between the second electrode Tr2$s$ of the thin film transistor Tr2 and the first electrode Tr3$d$ of the thin film transistor Tr3.

The top gate electrodes Tr2$tg$ and Tr3$tg$ are connected to the second electrode Tr3$s$ and the second wiring 4.

According to this structure, the application circuit 6 applies the voltage of the connection point 11A between the thin film transistor Tr2 and the thin film transistor Tr3 to the gate electrode Tr1g of the thin film transistor Tr1. That is, the application circuit 6 including the thin film transistor Tr2 and the thin film transistor Tr3 is a voltage division circuit that generates the gate voltage of the thin film transistor Tr1, which will be described in detail below. The thin film transistor Tr1 is operated by the gate voltage generated by the voltage division circuit and controls the line current which flows from the first wiring 3 to the second wiring 4.

FIG. 3 is a vertical cross-sectional view illustrating the configuration of the thin film transistor with the double gate structure according to the first embodiment. The thin film transistors illustrated in FIG. 3 are the thin film transistor Tr2 and the thin film transistor Tr3 provided in the protection circuit 1A according to this embodiment. FIG. 3 illustrates an example in which the thin film transistors Tr2 and Tr3 are channel-etched thin film transistors. In FIG. 3, reference numeral 20 indicates an insulating film.

The thin film transistor Tr2 includes the top gate electrode Tr2tg, the bottom gate electrode Tr2bg, the second electrode Tr2s, The first electrode Tr2d, the oxide semiconductor layer 22, and the insulating film 20. The thin film transistor Tr3 includes the top gate electrode Tr3tg, the bottom gate electrode Tr3bg, the second electrode Tr3s, The first electrode Tr3d, the oxide semiconductor layer 22, and the insulating film 20.

As illustrated in FIG. 3, the top gate electrode Tr2tg, Tr3tg is provided at the upper surface side of the oxide semiconductor layer 22 and the bottom gate electrode Tr2bg, Tr3bg is provided at the lower surface side of the oxide semiconductor layer 22, the lower surface side of which is opposite to the upper surface side. That is, the top gate electrodes Tr2tg and Tr3tg, and the bottom gate electrodes Tr2bg and Tr3bg are provided so as to face each other across the oxide semiconductor layer 22.

The first electrodes Tr2d and Tr3d, and the second electrodes Tr2s and Tr3s are provided so as to come into contact with both ends of the oxide semiconductor layer 22.

Next, the operation of the protection circuit 1A according to this embodiment, particularly, the operation of the application circuit 6 that functions as a voltage division circuit will be described.

The protection circuit 1A according to this embodiment operates when the input voltage $V_{IN}$ is positive with respect to the reference potential (GND).

That is, when the input voltage $V_{IN}$ is equal to or greater than the sum of the threshold voltages of the thin film transistors Tr2 and Tr3, the thin film transistors Tr2 and Tr3 are turned on (ON state). When the thin film transistors Tr2 and Tr3 in the application circuit 6 are turned on, the application circuit 6 functions as a voltage division circuit and a voltage obtained by dividing the input voltage $V_{IN}$ is applied to the gate electrode Tr1g of the thin film transistor Tr1.

For example, when an overvoltage caused by static electricity is applied to the first wiring 3 and a voltage obtained by dividing the overvoltage by the application circuit 6 is higher than the threshold voltage of the thin film transistor Tr1, the thin film transistor Tr1 is turned on.

When the thin film transistor Tr1 is turned on, current flows from the first wiring 3 to the second wiring 4 through the thin film transistor Tr1. In this way, it is possible to prevent an overvoltage from being applied to the device 7 to be protected.

Next, the control of a gate voltage $V_{G1}$ of the thin film transistor Tr1 will be described.

For example, it is assumed that the thin film transistors Tr2 and Tr3 operate in a saturation region. This assumption is established when the voltage $V_{IN}$ between both ends of the protection circuit 1A is greater than the sum of the threshold voltages of the thin film transistors Tr2 and Tr3.

In this assumption, the gate voltage $V_{G1}$ applied to the gate electrode Tr1g of the thin film transistor Tr1 is represented by the following Expression (1).

[Expression 1]

$$V_{G1} = \frac{1}{\sqrt{\frac{W_3}{L_3}} + \sqrt{\frac{W_2}{L_2}}} \left( \sqrt{\frac{W_2}{L_2}} V_{IN} + \sqrt{\frac{W_3}{L_3}} V_{th3} - \sqrt{\frac{W_2}{L_2}} V_{th2} \right) \quad (1)$$

In Expression (1), $W_2$ is a channel width of the thin film transistor Tr2 and $L_2$ is a channel length of the thin film transistor Tr2. A value ($W_2/L_2$) obtained by dividing the channel width $W_2$ by the channel length $L_2$ is described as an aspect ratio of the thin film transistor Tr2. $W_3$ is a channel width of the thin film transistor Tr3 and $L_3$ is a channel length of the thin film transistor Tr3. A value ($W_3/L_3$) obtained by dividing the channel width $W_3$ by the channel length $L_3$ is described as an aspect ratio of the thin film transistor Tr3.

$V_{th2}$ is the threshold voltage of the thin film transistor Tr2 and $V_{th3}$ is the threshold voltage of the thin film transistor Tr3. In Expression (1), it is assumed that the thin film transistors Tr2 and Tr3 have the same mobility and the same gate insulating film thickness.

Expression (1) is a result when drain current $I_d$ in the saturation region of the thin film transistors Tr2 and Tr3 can be approximated by the following Expression (2). In Expression (2), μ is mobility and C is gate capacitance per unit area. When Expression (1) is derived, it is assumed that the transistors Tr2 and Tr3 have the same mobility (μ) and gate capacitance (C).

[Expression 2]

$$I_d = \frac{1}{2} \mu C \frac{W}{L} (V_g - V_{th})^2 \quad (2)$$

As can be seen from Expression (1), by changing the aspect ratio of the thin film transistor Tr2 and the aspect ratio of the thin film transistor Tr3, that is, the resistance ratio of the thin film transistor Tr2 and the thin film transistor Tr3, the gate voltage $V_{G1}$ of the thin film transistor Tr1 is controlled.

For example, when the voltage $V_{IN}$ between both ends of the protection circuit 1A at which the thin film transistor Tr1 is turned on is set to be a high value, that is, when the voltage at which the protection circuit 1A operates is set to be a high value, it is designed so that the aspect ratio ($W_2/L_2$) of the thin film transistor Tr2 is lower than the aspect ratio ($W_3/L_3$) of the thin film transistor Tr3. In contrast, when the voltage $V_{IN}$ between both ends of the protection circuit 1A at which the thin film transistor Tr1 is turned on is set to be a low value, that is, when the voltage at which the protection circuit 1A operates is set to be a low value, it is designed so that the aspect ratio ($W_2/L_2$) of the thin film transistor Tr2 is higher than the aspect ratio ($W_3/L_3$) of the thin film transistor Tr3.

For example, when a semiconductor layer forming a thin film transistor is made of poly-Si, the impurities doped semiconductor layer can be used as a resistor to control the gate voltage of the thin film transistor. However, when an oxide semiconductor is used as the semiconductor layer, the resistance of the semiconductor layer is reduced due to impurity doping. Therefore, it is difficult to use the semiconductor layer as a resistor. In contrast, a no impurities doped semiconductor layer has a high resistance value which is substantially regarded as an insulator. Therefore, it is difficult to use the semiconductor layer as a resistor. As a result, it is difficult to generate an appropriate gate voltage to be applied to the gate electrode of the thin film transistor by adjusting the resistance of the oxide semiconductor.

In this embodiment, as described above, attention is not paid to the resistance value, but is paid to the channel length and the channel width, that is, both the aspect ratio of the thin film transistor Tr2 and the aspect ratio of the thin film transistor Tr3 are changed. Therefore, it is possible to simply control the gate voltage $V_{G1}$ of the thin film transistor Tr1, using an oxide semiconductor.

In addition, as described above, the thin film transistors Tr2 and Tr3 according to this embodiment are oxide semiconductor TFTs with a double gate structure. When the thin film transistor has the double gate structure, the threshold voltage $V_{th}$ is represented by the following Expression (3). Here, $V_{TGS}$ is a top gate voltage, $V_{th0}$ is a threshold voltage when the top gate voltage $V_{TGS}$ is 0 V (which is equal to a source voltage), and α is a coefficient indicating a positive value.

[Expression 3]

$$V_{th} = V_{th0} - \alpha V_{TGS} \quad (3)$$

Expression (3) indicates that, in the oxide semiconductor TFT having the double gate structure, the top gate voltage $V_{TGS}$ is adjusted to control the threshold voltage $V_{th}$.

As illustrated in FIG. 1, in the application circuit 6 according to this embodiment, the top gate electrodes Tr2tg and Tr3tg of the thin film transistors Tr2 and Tr3 are connected to the second electrode Tr3s which functions as the source electrode of the thin film transistor Tr3. Therefore, the top gate voltage of the thin film transistor Tr3 is equal to the source voltage of the thin film transistor Tr3. In contrast, the top gate voltage of the thin film transistor Tr2 is lower than the source voltage of the thin film transistor Tr2 by a source-drain voltage of the thin film transistor Tr3.

That is, the thin film transistors Tr2 and Tr3 are configured so as to have the double gate structure and the top gate electrodes Tr2tg and Tr3tg of the thin film transistors Tr2 and Tr3 are connected to each other and are connected to the second wiring 4. According to this structure, a change in the threshold voltage $V_{th2}$ of the thin film transistor Tr2 can be larger than a change in the threshold voltage $V_{th3}$ of the thin film transistor Tr3.

Therefore, in the protection circuit 1A according to this embodiment, Expression (1) is represented by the following Expression (4).

[Expression 4]

$$V_{G1} = \frac{1}{\sqrt{\frac{W_3}{L_3}} + (1+\alpha)\sqrt{\frac{W_2}{L_2}}} \left( \sqrt{\frac{W_2}{L_2}} V_{IN} + \sqrt{\frac{W_3}{L_3}} V_{th3} - \sqrt{\frac{W_2}{L_2}} V_{th2} \right) \quad (4)$$

Since the coefficient α is a positive value, the gate voltage $V_{G1}$ of the thin film transistor Tr1 is lower than that in Expression (1), as indicated in Expression (4). That is, when the thin film transistors Tr2 and Tr3 have the double gate structure, it is possible to further increase the input voltage $V_{IN}$ at which the protection circuit 1A operates (the thin film transistor Tr1 is turned on).

Therefore, according to the protection circuit 1A of this embodiment, it is possible to appropriately control the operating voltage (the gate voltage $V_{G1}$ of the thin film transistor Tr1) of the protection circuit 1A with a simple structure.

In addition, according to the protection circuit 1A of this embodiment, it is possible to arbitrarily set the operating voltage of the thin film transistor Tr1, without preparing, for example, a separate power supply.

Figure 4:
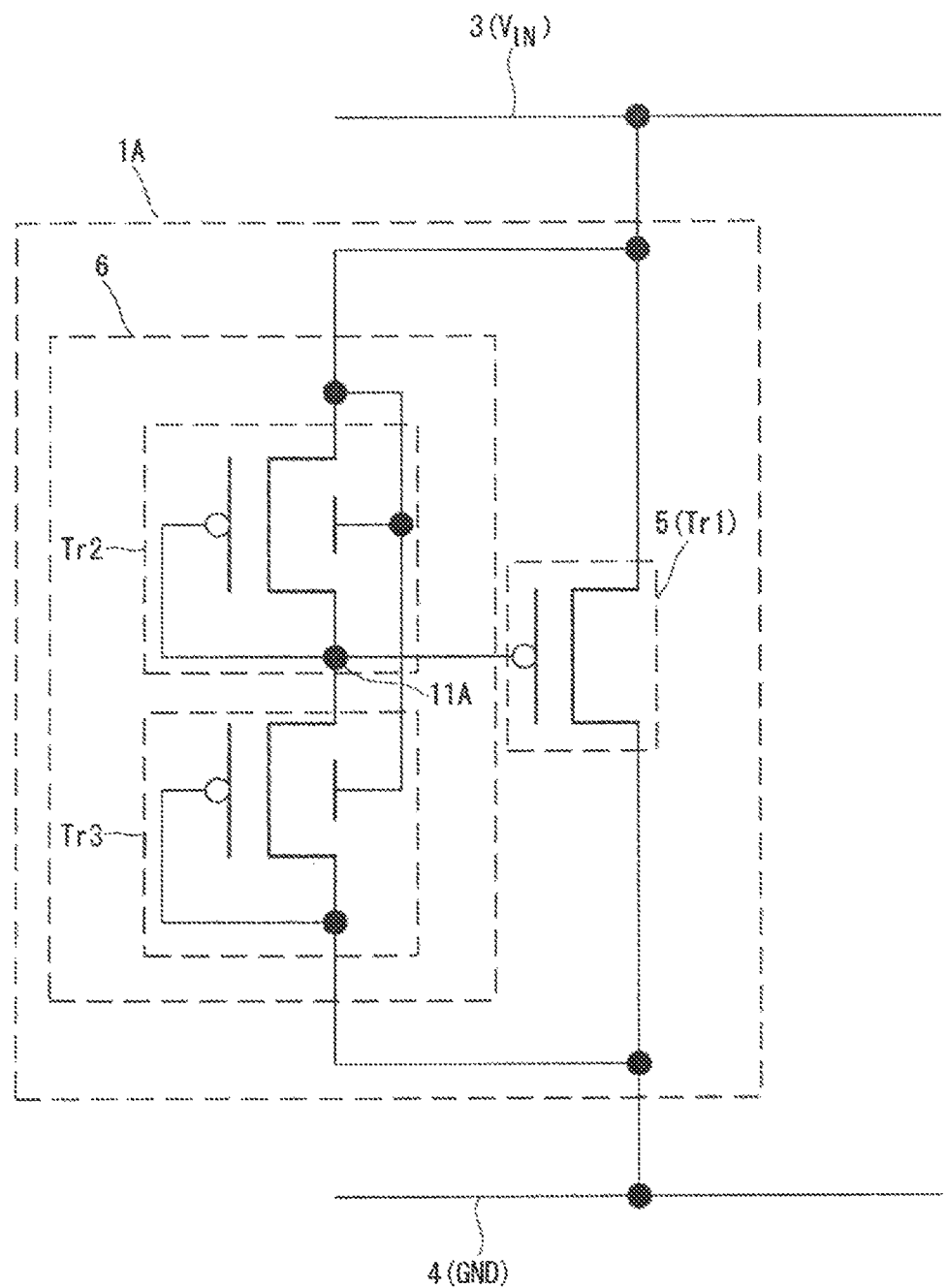
FIG. 4 is a circuit diagram illustrating a modification example of the protection circuit according to the first embodiment.

FIG. 4 is a circuit diagram illustrating a modification example of the protection circuit 1A according to this embodiment. In the modification example illustrated in FIG. 4, the thin film transistors Tr1, Tr2, and Tr3 are p-channel transistors. Since the polarity of p-channel thin film transistors Tr1, Tr2, and Tr3 are inverted to that of the n-channel transistor, their connection relationship between the electrodes is also inverted to that of the n-channel transistor.

Figure 5:
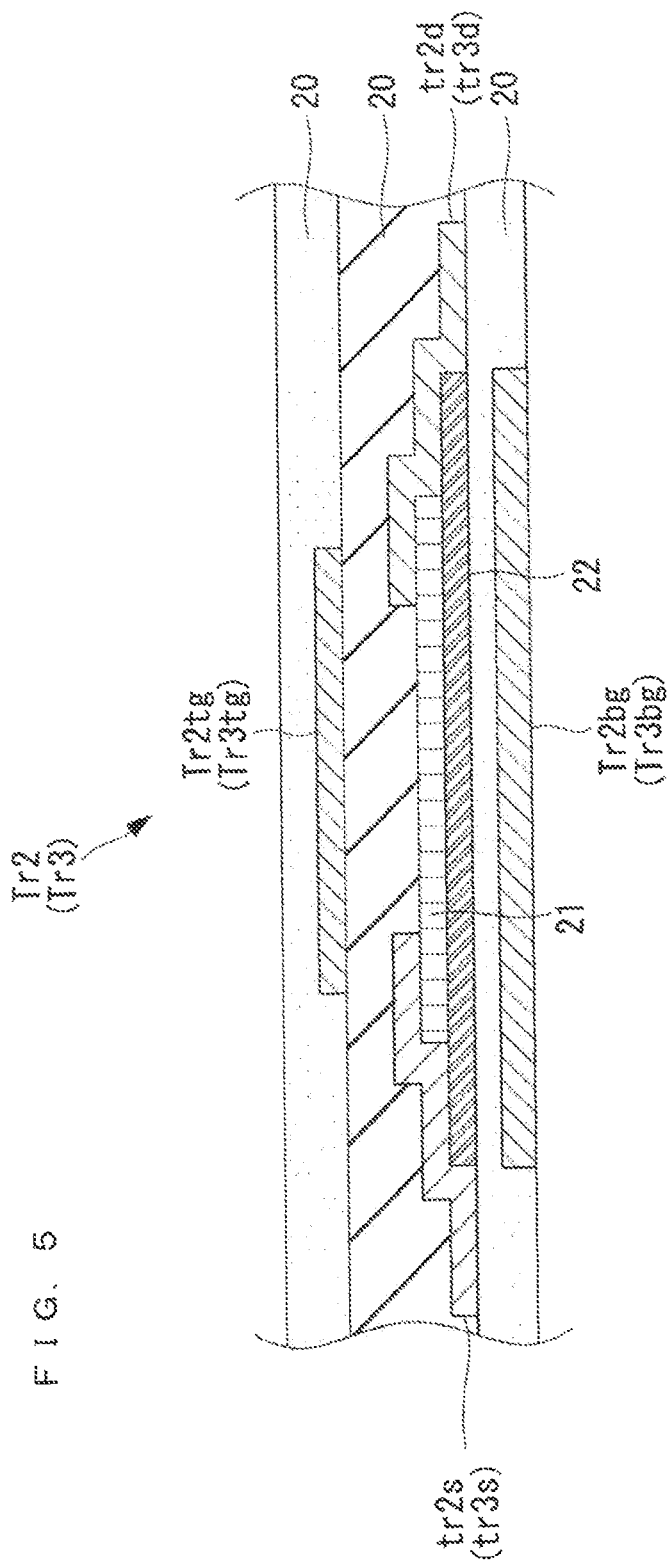
FIG. 5 is a vertical cross-sectional view illustrating a modification example of the thin film transistor with the double gate structure according to the first embodiment.

FIG. 5 is a vertical cross-sectional view illustrating a modification example of the thin film transistors Tr2 and Tr3 with the double gate structure according to this embodiment. In the modification example illustrated in FIG. 5, the thin film transistors Tr2 and Tr3 are a channel protection type and an insulating layer 21 which functions as a protective film is formed at an upper surface side of the oxide semiconductor layer 22.

According to an aspect of the embodiment, it is possible to appropriately control the operating voltage of the protection circuit 1A with a simple structure.

Second Embodiment

Figure 6:
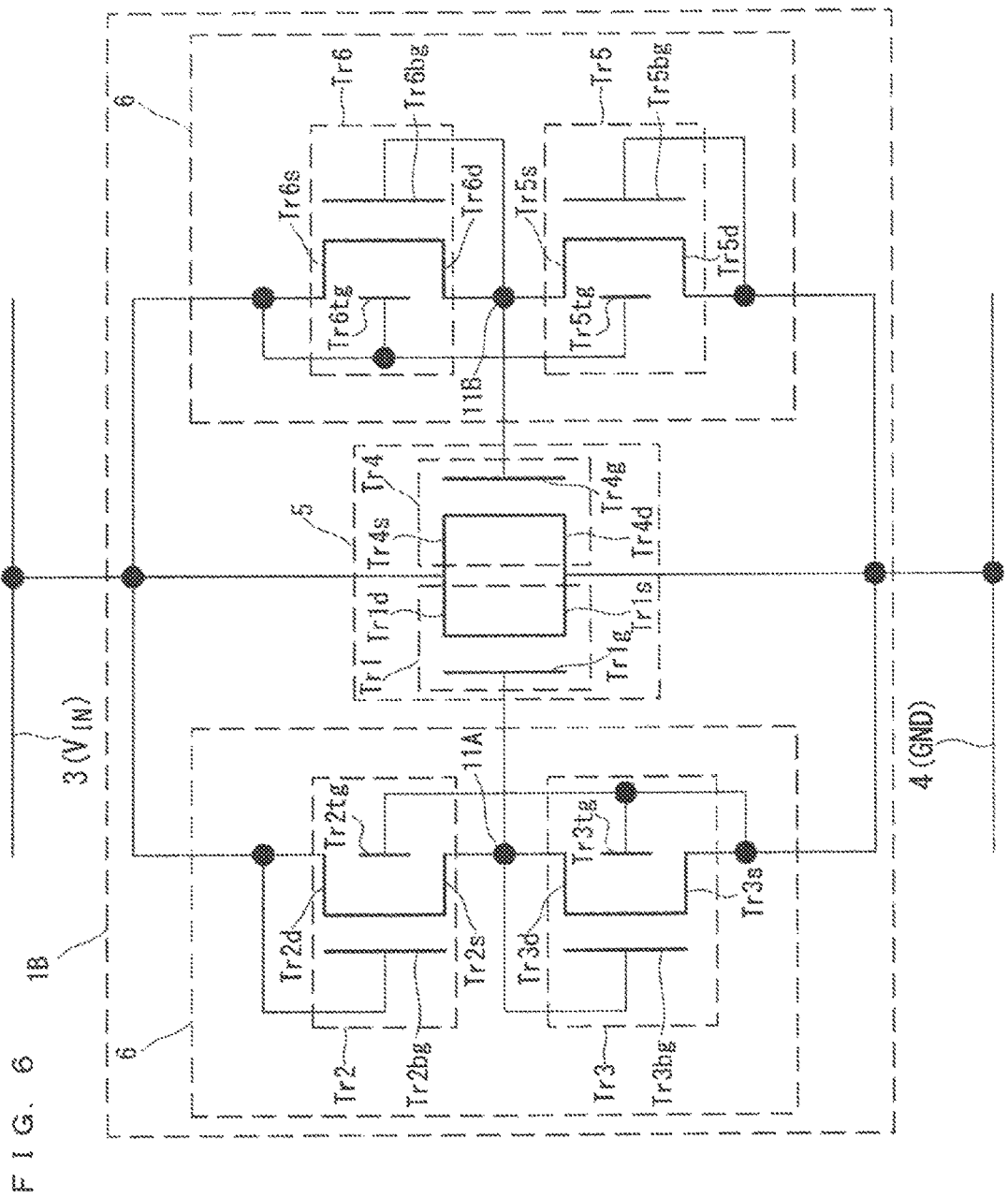
FIG. 6 is a circuit diagram illustrating the configuration of a protection circuit according to a second embodiment.

Hereinafter, a second embodiment will be described. FIG. 6 is a circuit diagram illustrating the configuration of a protection circuit 1B according to this embodiment. In FIG. 6, the same components as those in FIG. 1 are denoted by the same reference numerals as those in FIG. 1 and the description thereof will not be repeated.

A control circuit 5 provided in the protection circuit 1B further includes a thin film transistor Tr4 which is connected in parallel to the thin film transistor Tr1. The thin film transistor Tr4 also controls line current. Here, when a negative overvoltage is applied to the first wiring 3, current flows from the second wiring 4 to the first wiring 3 and the thin film transistor Tr4 operates so as to protect an object to be protected from the overvoltage.

The thin film transistor Tr4 has a second electrode Tr4s that is connected to the first wiring 3 and a first electrode Tr4d that is connected to the second wiring 4. A gate electrode Tr4g of the thin film transistor Tr4 is connected to the application circuit 6 at a connection point 11B. The thin film transistor Tr4 is an n-channel transistor. The first electrode Tr4d functions as a drain electrode and the second electrode Tr4s functions as a source electrode.

In addition, the application circuit 6 in the protection circuit 1B further includes a thin film transistor Tr5 and a thin film transistor Tr6 which are connected in series. The thin film transistors Tr5 and Tr6 are n-channel transistors and have first electrodes Tr5d and Tr6d that function as drain electrodes and second electrodes Tr5s and Tr6s that function as source electrodes, respectively.

The first electrode Tr5*d* of the thin film transistor Tr5 is connected to the second wiring 4 and the second electrode Tr5*s* of the thin film transistor Tr5 is connected to the first electrode Tr6*d* of the thin film transistor Tr6. The second electrode Tr6*s* of the thin film transistor Tr6 is connected to the first wiring 3.

The thin film transistor Tr4, the thin film transistor Tr5, and the thin film transistor Tr6 are oxide semiconductor TFTs having an oxide semiconductor layer 22.

Each of the thin film transistor Tr5 and the thin film transistor Tr6 is a transistor with a so-called double gate (dual gate) structure which includes a bottom gate and a top gate.

That is, the thin film transistor Tr5 includes a bottom gate electrode Tr5*bg* and a top gate electrode Tr5*tg*. The thin film transistor Tr6 includes a bottom gate electrode Tr6*bg* and a top gate electrode Tr6*tg*.

In this embodiment, the main control electrodes of the thin film transistors Tr5 and Tr6 are, for example, the bottom gate electrodes Tr5*bg* and Tr6*bg*.

The bottom gate electrode Tr5*bg* of the thin film transistor Tr5 is connected to the first electrode Tr5*d* and the second wiring 4. The bottom gate electrode Tr6*bg* of the thin film transistor Tr6 is connected to the first electrode Tr6*d*. The gate electrode Tr4*g* of the thin film transistor Tr4 is connected to the connection point 11B between the second electrode Tr5*s* of the thin film transistor Tr5 and the first electrode Tr6*d* of the thin film transistor Tr6.

The top gate electrodes Tr5*tg* and Tr6*tg* of the thin film transistors Tr5 and Tr6 are connected to the second electrode Tr6*s* of the thin film transistor Tr6 and the first wiring 3.

According to this structure, the application circuit 6 applies the voltage of the connection point 11B between the thin film transistor Tr5 and the thin film transistor Tr6 to the gate electrode Tr4*g* of the thin film transistor Tr4. That is, the application circuit 6 including the thin film transistor Tr5 and the thin film transistor Tr6 is a voltage division circuit that generates a gate voltage of the thin film transistor Tr4. The thin film transistor Tr4 is operated by the gate voltage generated by the voltage division circuit and controls the line current which flows from the second wiring 4 to the first wiring 3.

Here, when an input voltage $V_{IN}$ is negative with respect to a reference potential, a bottom gate voltage of the thin film transistors Tr2 and Tr3 becomes the voltage of the first electrodes Tr2*d* and Tr3*d*, that is, a negative voltage and no drain current flows. Therefore, the electrical potential at the connection point 11A between the thin film transistors Tr2 and Tr3 becomes a divided potential of the input voltage $V_{IN}$ according to the source-drain capacitance of the thin film transistor Tr2, the source-drain capacitance of the thin film transistor Tr3, and the gate-source capacitance and gate-drain capacitance of the thin film transistor Tr1.

Figure 7:
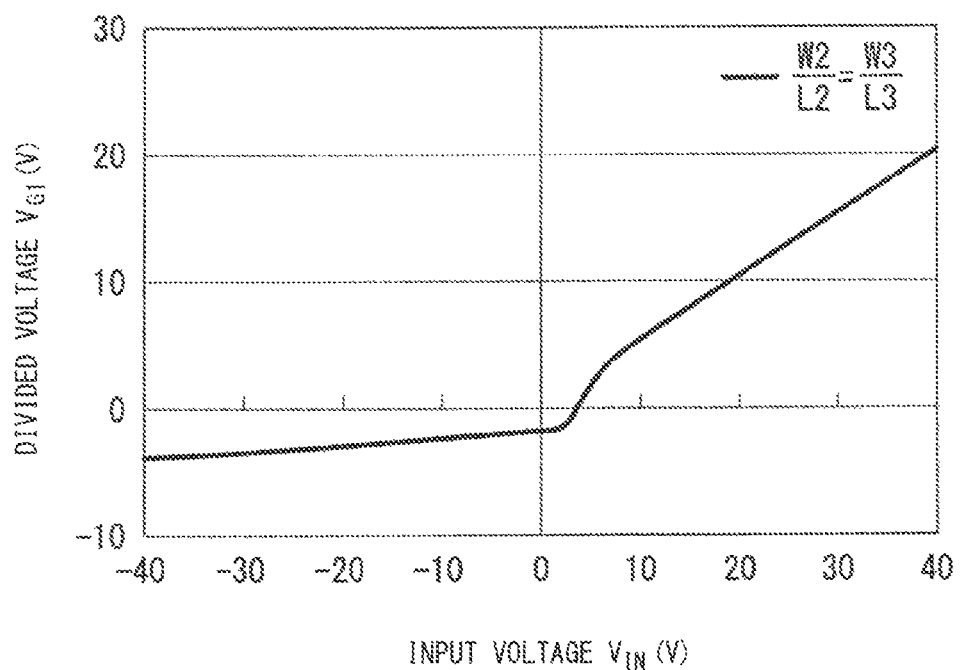
FIG. 7 is a graph illustrating the measurement result of a voltage (divided voltage) divided by thin film transistors according to the second embodiment.

FIG. 7 is a graph illustrating the measurement result of the voltage (divided voltage) divided by the thin film transistors Tr2 and Tr3 according to the second embodiment. In FIG. 7, the horizontal axis indicates the input voltage $V_{IN}$. In FIG. 7, the vertical axis indicates a divided voltage. The unit of the vertical axis and the horizontal axis in FIG. 7 is volts. The divided voltage on the vertical axis is the gate voltage $V_{G1}$ which is applied to the gate electrode Tr1*g* of the thin film transistor Tr1. The example illustrated in FIG. 7 illustrates the measurement result of the divided voltage in a sample in which the thin film transistors Tr2 and Tr3 having the same aspect ratio (L/W) is prepared.

As can be seen from FIG. 7, in case the input voltage $V_{IN}$ is positive, when the input voltage $V_{IN}$ is about 6 V or more (a voltage at which the thin film transistors Tr2 and Tr3 operate in a saturation region), the gate voltage $V_{G1}$ is about half (½) of the input voltage $V_{IN}$. In contrast, in case the input voltage $V_{IN}$ is negative, a negative voltage which is close to the reference potential (GND in this embodiment) is output as the gate voltage $V_{G1}$.

When the input voltage $V_{IN}$ is negative and the gate voltage $V_{G1}$ is as illustrated in the graph of FIG. 7, in the thin film transistor Tr1 the gate voltage $V_{G1}$ is higher than the voltage of the first electrode Tr1*d* (input voltage $V_{IN}$). Therefore, the thin film transistor Tr1 is turned on and current flows from the second wiring 4 to the first wiring 3.

Figure 8:
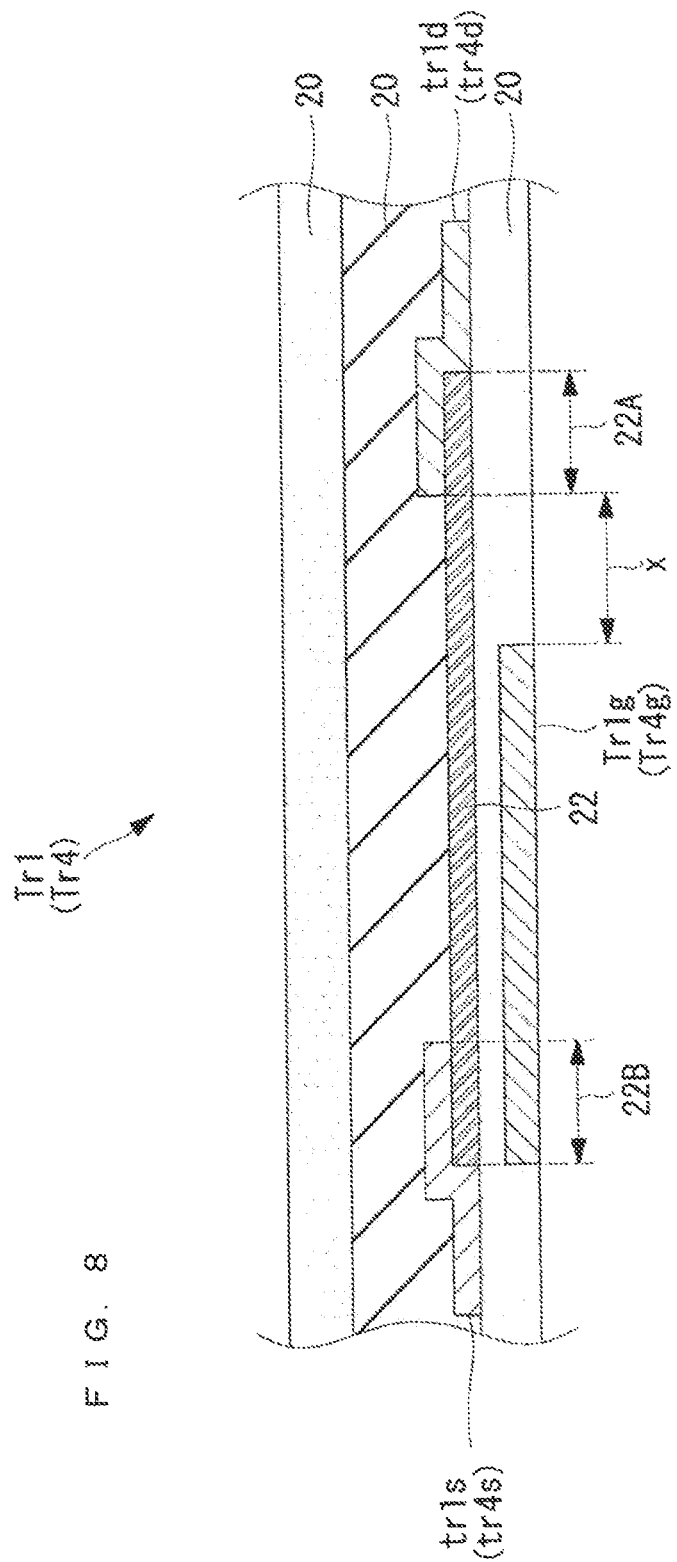
FIG. 8 is a vertical cross-sectional view illustrating the configuration of a thin film transistor with an offset gate structure according to the second embodiment.

The thin film transistors Tr1 and Tr4 have an offset gate structure illustrated in FIG. 8 in order to prevent the thin film transistor Tr1 from being turned on when the input voltage $V_{IN}$ is negative. When the thin film transistors Tr1 and Tr4 have the offset gate structure, the thin film transistors Tr1 and Tr4 have a rectifying effect.

FIG. 8 is a vertical cross-sectional view illustrating the configuration of the thin film transistors Tr1 and Tr4 with the offset gate structure according to the second embodiment. FIG. 8 illustrates an example in which the thin film transistors Tr1 and Tr4 are channel-etched thin film transistors.

The thin film transistor Tr1 includes the gate electrode Tr1*g*, the second electrode Tr1*s*, The first electrode Tr1*d*, the oxide semiconductor layer 22, and the insulating film 20. The thin film transistor Tr4 includes the gate electrode Tr4*g*, the second electrode Tr4*s*, The first electrode Tr4*d*, the oxide semiconductor layer 22, and the insulating film 20.

The thin film transistor Tr1 according to this embodiment has an offset gate structure in which the gate electrode Tr1*g* is offset from the first electrode Tr1*d* (first metal terminal) connected to the first wiring 3. In contrast, the thin film transistor Tr4 has an offset gate structure in which the gate electrode Tr4*g* is offset from the first electrode Tr4*d* (second metal terminal) connected to the second wiring 4.

Specifically, the thin film transistor Tr1 includes the first electrode Tr1*d* (first metal terminal), the second electrode Tr1*s* (third metal terminal), and an oxide semiconductor layer 22 that is provided at the upper surface side of the gate electrode Tr1*g* with an insulating film 20 interposed therebetween.

The first electrode Tr1*d* comes into contact with a first region 22A, which is close to the first wiring 3, in the upper surface of the oxide semiconductor layer 22. The second electrode Tr1*s* comes into contact with a second region 22B, which is opposite to the first region 22A, in the upper surface of the oxide semiconductor layer 22. The gate electrode Tr1*g* is separated from the first region 22A so as to be offset in a direction from the first region 22A to the second region 22B of the oxide semiconductor layer 22. The first region 22A is also referred to as a source region or a drain region. The second region 22B is also referred to as a drain region or a source region.

The thin film transistor Tr4 includes the first electrode Tr4*d* (second metal terminal), the second electrode Tr4*s* (fourth metal terminal), and an oxide semiconductor layer 22 that is provided at the upper surface side of the gate electrode Tr4*g* with an insulating film 20 interposed therebetween.

The first electrode Tr4*d* comes into contact with a first region 22A, which is close to the second wiring 4, in the upper surface of the oxide semiconductor layer 22. The second electrode Tr4*s* comes into contact with a second region 22B, which is opposite to the first region 22A, in the upper surface of the oxide semiconductor layer 22. The gate electrode Tr4*g* is separated from the first region 22A so as to be offset in a direction from the first region 22A to the second region 22B of the oxide semiconductor layer 22.

In other words, in the thin film transistor Tr1, an end of the gate electrode Tr1g which is close to the first electrode Tr1d is arranged so as to be a predetermined distance x away from an end of the first electrode Tr1d in a direction perpendicular to the laminated direction of the oxide semiconductor layer 22. The end of the first electrode Tr1d is an end of the first region 22A where the first electrode Tr1d is in contact with the oxide semiconductor layer 22.

In the thin film transistor Tr4, an end of the gate electrode Tr4g which is close to the first electrode Tr4d is arranged so as to be the predetermined distance x away from an end of the first electrode Tr4d in the direction perpendicular to the laminated direction of the oxide semiconductor layer 22. The end of the first electrode Tr4d is an end of the first region 22A where the first electrode Tr4d is in contact with the oxide semiconductor layer 22. The first region 22A is also referred to a third region, the second region 22B is also referred to a forth region, in explaining the thin film transistor Tr4.

Next, the operation of the protection circuit 1B according to the second embodiment will be described.

As described above, in the thin film transistor Tr1, a portion which is close to the first wiring 3 and is arranged in the vicinity of the first electrode Tr1d is an offset gate. Therefore, when the voltage of the first wiring 3 connected to the first electrode Tr1d is higher than the voltage of the second wiring 4, current flows through the thin film transistor Tr1. On the other hand, when the voltage of the second wiring 4 connected to the second electrode Tr1s is higher than the voltage of the first wiring 3, no current flows through the thin film transistor Tr1.

In the thin film transistor Tr4, a portion which is close to the second wiring 4 and is arranged in the vicinity of the first electrode Tr4d is an offset gate. Therefore, when the voltage of the second wiring 4 connected to the first electrode Tr4d is higher than the voltage of the first wiring 3, current flows through the thin film transistor Tr4. On the other hand, when the voltage of the first wiring 3 connected to the second electrode Tr4s is higher than the voltage of the second wiring 4, no current flows through the thin film transistor Tr4.

As such, in the protection circuit 1B according to this embodiment, when the input voltage $V_{IN}$ is positive with respect to the reference potential, the thin film transistors Tr1, Tr2, and Tr3 prevent an overvoltage from being applied to an object to be protected. When the input voltage $V_{IN}$ is negative with respect to the reference potential, the thin film transistors Tr4, Tr5, and Tr6 prevent an overvoltage from being applied to the object to be protected.

Figure 9:
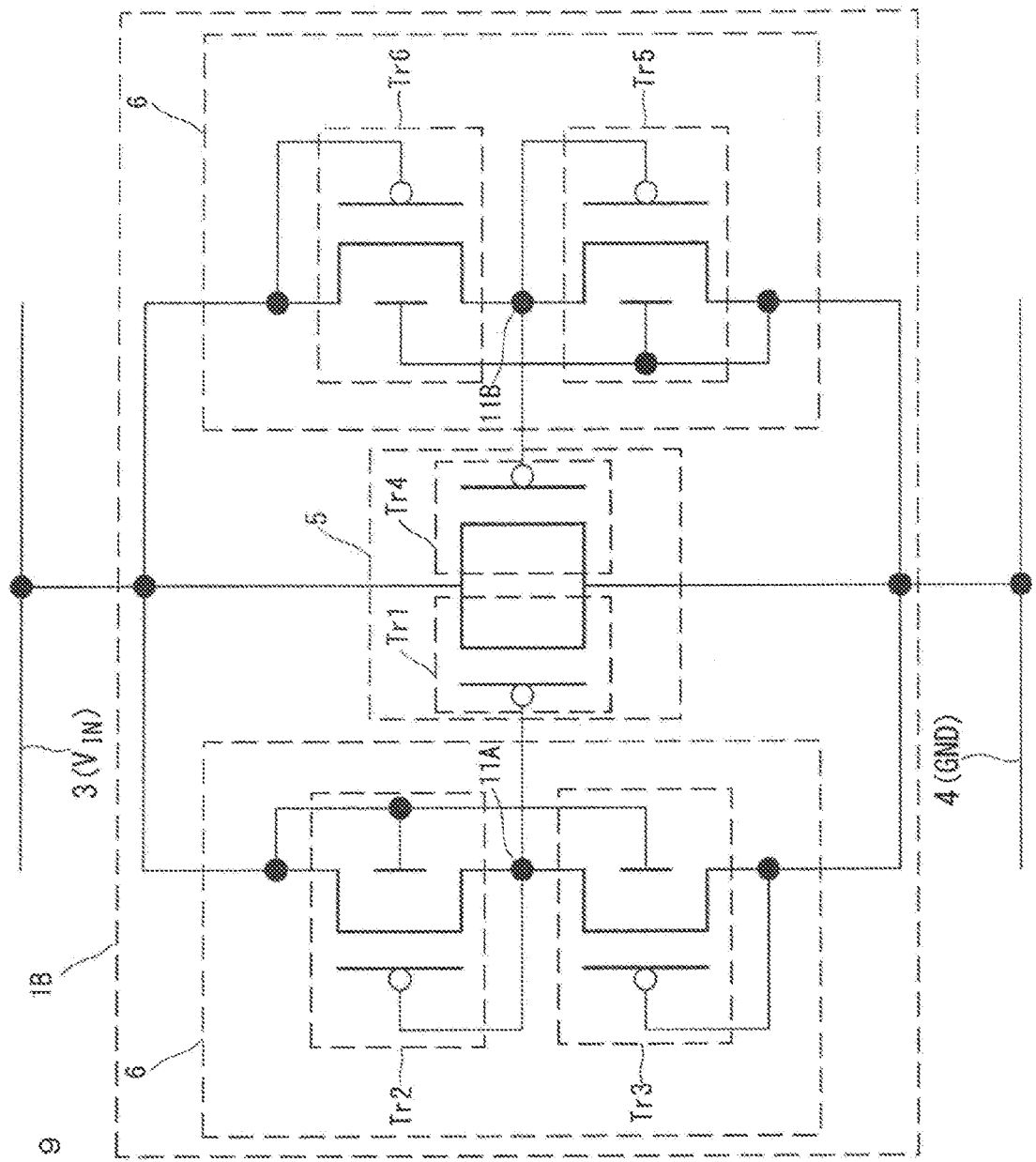
FIG. 9 is a circuit diagram illustrating a modification example of the protection circuit according to the second embodiment.

FIG. 9 is a circuit diagram illustrating a modification example of the protection circuit 1B according to the second embodiment. In the modification example illustrated in FIG. 9, the thin film transistors Tr1, Tr2, and Tr3 are p-channel transistors. Since the polarity of p-channel thin film transistors Tr1, Tr2, and Tr3 are inverted to that of the n-channel transistor, their connection relationship between the electrodes is also inverted to that of the n-channel transistor.

Figure 10:
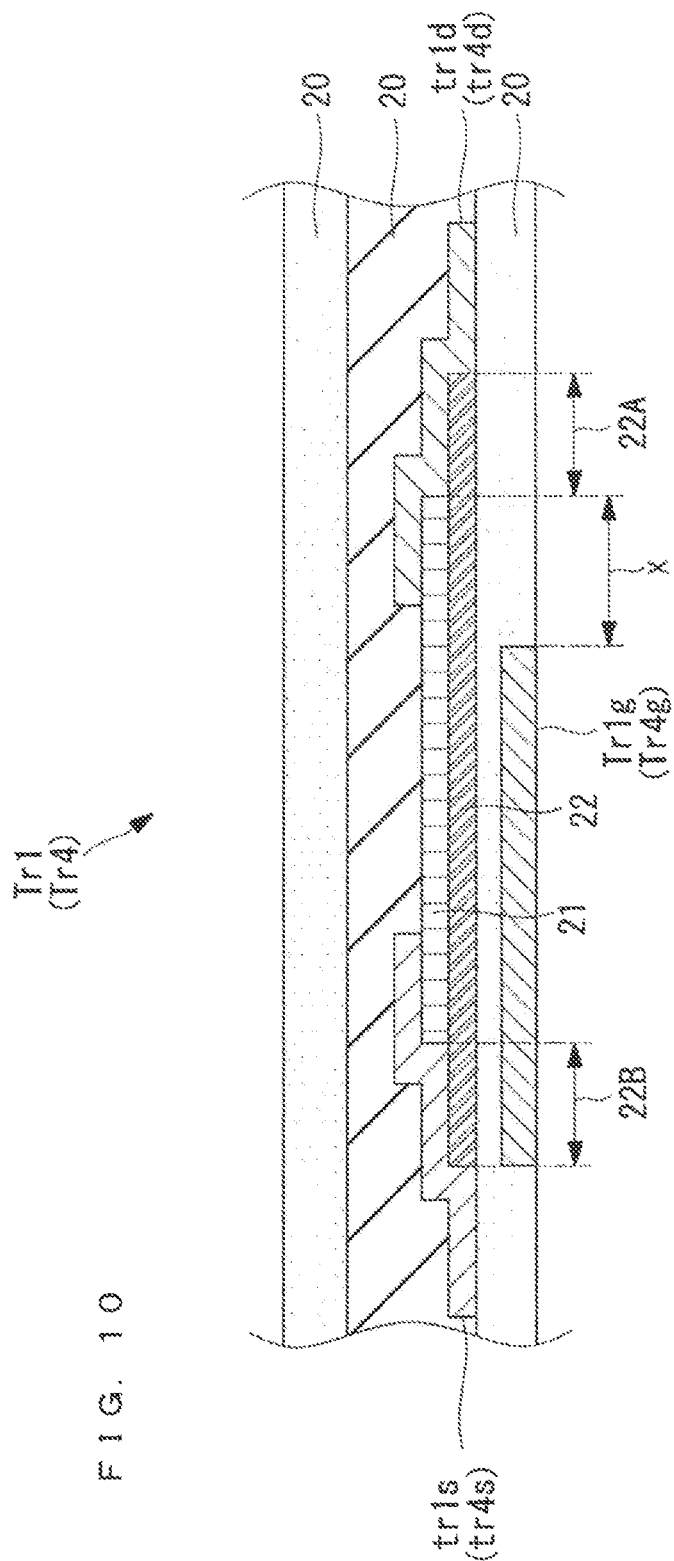
FIG. 10 is a vertical cross-sectional view illustrating a modification example of the thin film transistor with the offset gate structure according to the second embodiment.

FIG. 10 is a vertical cross-sectional view illustrating a modification example of the thin film transistors Tr1 and Tr4 with the offset gate structure according to the second embodiment. In the modification example illustrated in FIG. 10, the thin film transistors Tr1 and Tr4 are a channel protection type and an insulating layer 21 that functions as a protective film is formed at the upper surface side of the oxide semiconductor layer 22.

Third Embodiment

Hereinafter, a third embodiment will be described.

A thin film transistor Tr1 and a thin film transistor Tr4 according to this embodiment do not have an offset gate structure, as in the second embodiment. This is because a protection circuit 1C controls line current, using both the thin film transistor Tr1 and the thin film transistor Tr4, regardless of the polarity of an input voltage $V_{IN}$.

FIG. 11 is a circuit diagram illustrating the configuration of the protection circuit 1C according to the third embodiment. In FIG. 11, the same components as those in FIG. 6 are denoted by the same reference numerals as those in FIG. 6 and the description thereof will not be repeated.

In a control circuit 5 according to this embodiment, the thin film transistor Tr1 and the thin film transistor Tr4 are connected in series to each other. That is, the second electrode Tr1s of the thin film transistor Tr1 is connected to the second wiring 4, the first electrode Tr1d of the thin film transistor Tr1 is connected to the first electrode Tr4d of the thin film transistor Tr4 and the second electrode Tr4s of the thin film transistor Tr4 is connected to the first wiring 3.

Next, the operation of the protection circuit 1C according to this embodiment will be described.

When the input voltage $V_{IN}$ is positive with respect to the reference potential (GND) and a voltage divided by the thin film transistors Tr2 and Tr3 is higher than the threshold voltage of the thin film transistor Tr1, the thin film transistor Tr1 is turned on.

In this case, the gate voltage of the thin film transistor Tr4 is controlled by the thin film transistors Tr5 and Tr6. However, since the bottom gate voltage of the thin film transistor Tr5 is equal to the reference voltage (GND), no current flows.

Therefore, the gate voltage of the thin film transistor Tr4 is a voltage obtained by dividing the input voltage $V_{IN}$ according to the source-drain capacitance of the thin film transistor Tr5, the source-drain capacitance of the thin film transistor Tr6, and the gate-source capacitance and gate-drain capacitance of the thin film transistor Tr6. The divided voltage is lower than the input voltage $V_{IN}$ and is higher than the reference potential (GND).

When the thin film transistor Tr1 is turned on, the voltage of the first electrode Tr4d of the thin film transistor Tr4 is substantially equal to the reference potential (GND). Therefore, the voltage of the gate electrode Tr4g of the thin film transistor Tr4 is higher than the voltage of the first electrode Tr4d in the thin film transistor Tr4 and the thin film transistor Tr4 is turned on. Therefore, current which is generated due to an overvoltage can flow from the first wiring 3 to the second wiring 4 through the thin film transistor Tr1 and the thin film transistor Tr4.

Similarly, when the input voltage $V_{IN}$ is negative with respect to the reference potential (GND), the operation of a set of the thin film transistor Tr1, the thin film transistor Tr2, and the thin film transistor Tr3 and a set of the thin film transistor Tr4, the thin film transistor Tr5, and the thin film transistor Tr6 can be reversed to the above-mentioned operation and current which is caused by an overvoltage can flow from the first wiring 3 to the second wiring 4 through the thin film transistor Tr1 and the thin film transistor Tr4.

FIG. 12 is a circuit diagram illustrating a modification example of the protection circuit 1C according to the third embodiment. In the modification example illustrated in FIG.

12, the thin film transistors Tr1, Tr2, and Tr3 are p-channel transistors. Since the polarity of thin film transistors Tr1, Tr2, and Tr3 are inverted to that of the n-channel transistor, their connection relationship between the electrodes is also inverted to that of the n-channel transistor.

In addition, technical characteristics (configuration requirements) described in each embodiment may be combined with each other, and new technical characteristics may be formed by combining the same.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A protection circuit comprising:
   a control circuit that controls current between a first wiring and a second wiring; and
   an application circuit that applies a voltage to the control circuit, wherein the control circuit includes a first thin film transistor that controls the current,
   the application circuit includes a second thin film transistor and a third thin film transistor that are connected in series to each other between the first wiring and the second wiring,
   each of the second thin film transistor and the third thin film transistor includes a first gate and a second gate,
   the first gate of the second thin film transistor is connected to the first wiring,
   the first gate of the third thin film transistor is connected to a connection point between the second thin film transistor and the third thin film transistor,
   the second gates of the second thin film transistor and the third thin film transistor are directly connected to the second wiring, and
   the application circuit applies a voltage of the connection point to a gate of the first thin film transistor.

2. The protection circuit according to claim 1,
   wherein each of the first thin film transistor, the second thin film transistor, and the third thin film transistor include an oxide semiconductor layer.

3. The protection circuit according to claim 2,
   wherein the first gates of the second thin film transistor and the third thin film transistor are provided so as to be close to a first surface of the oxide semiconductor layer, and
   the second gates of the second thin film transistor and the third thin film transistor are provided so as to be close to a second surface that is opposite to the first surface of the oxide semiconductor layer.

4. The protection circuit according to claim 1,
   wherein the control circuit further includes a fourth thin film transistor that is connected in parallel to the first thin film transistor,
   the application circuit further includes a fifth thin film transistor and a sixth thin film transistor that are connected in series to each other,
   each of the fifth thin film transistor and the sixth thin film transistor includes a first gate and a second gate,
   the first gate of the fifth thin film transistor is connected to the second wiring,
   the first gate of the sixth thin film transistor is connected to a connection point between the fifth thin film transistor and the sixth thin film transistor,
   the second gates of the fifth thin film transistor and the sixth thin film transistor are connected to the first wiring, and
   the application circuit applies a voltage of the connection point between the fifth thin film transistor and the sixth thin film transistor to a gate of the fourth thin film transistor.

5. The protection circuit according to claim 4,
   wherein the first thin film transistor has an offset gate structure in which the gate of the first thin film transistor is offset from a first metal terminal connected to the first wiring, and
   the fourth thin film transistor has an offset gate structure in which the gate of the fourth thin film transistor is offset from a second metal terminal connected to the second wiring.

6. The protection circuit according to claim 5,
   wherein the first thin film transistor includes the first metal terminal, a third metal terminal, and a semiconductor layer that is provided over an upper surface of the gate of the first thin film transistor with an insulating film interposed therebetween,
   the first metal terminal comes into contact with a first region which is close to the first wiring in an upper surface of the semiconductor layer,
   the third metal terminal comes into contact with a second region which is opposite to the first region in the upper surface of the semiconductor layer,
   the gate of the first thin film transistor is separated from the first region so as to be offset in a direction from the first region to the second region of the semiconductor layer,
   the fourth thin film transistor includes the second metal terminal, a fourth metal terminal, and the semiconductor layer that is provided over an upper surface of the gate of the fourth thin film transistor with the insulating film interposed therebetween,
   the second metal terminal comes into contact with the first region which is close to the second wiring in the upper surface of the semiconductor layer,
   the fourth metal terminal comes into contact with the second region which is opposite to the first region in the upper surface of the semiconductor layer, and
   the gate of the fourth thin film transistor is separated from the first region so as to be offset in a direction from the first region to the second region of the semiconductor layer.

7. The protection circuit according to claim 1,
   wherein the control circuit further includes a fourth thin film transistor that is connected in series to the first thin film transistor,
   the application circuit further includes a fifth thin film transistor and a sixth thin film transistor that are connected in series to each other,
   each of the fifth thin film transistor and the sixth thin film transistor includes a first gate and a second gate,
   the first gate of the fifth thin film transistor is connected to the second wiring,
   the first gate of the sixth thin film transistor is connected to a connection point between the fifth thin film transistor and the sixth thin film transistor,
   the second gates of the fifth thin film transistor and the sixth thin film transistor are connected to the first wiring, and the application circuit applies a voltage of the connection point between the fifth thin film transistor and the sixth thin film transistor to a gate of the fourth thin film transistor.

8. The protection circuit according to claim 4,
wherein the first thin film transistor controls current that flows from the first wiring to the second wiring, and
the fourth thin film transistor controls current that flows from the second wiring to the first wiring.

9. An electronic device comprising the protection circuit according to claim 1.

10. The protection circuit according to claim 1,
wherein the first thin film transistor controls the current from the first wiring to the second wiring.

11. The protection circuit according to claim 10,
wherein each of the second thin film transistor and the third thin film transistor includes further a first electrode and a second electrode,
the first electrode of the first thin film transistor is connected to the first wiring,
the second electrode of the first thin film transistor is connected to the second wiring,
the first electrode of the second thin film transistor is connected to the first wiring,
the second electrode of the third thin film transistor is connected to the second wiring, and
the second electrode of the second thin film transistor is connected to the first electrode of the third thin film transistor.

* * * * *